(12) United States Patent
Nara

(10) Patent No.: US 7,554,338 B2
(45) Date of Patent: Jun. 30, 2009

(54) DISPLAY FOR MEASURING PHASE NOISE CHARACTERISTICS

(75) Inventor: Akira Nara, Tokyo (JP)

(73) Assignee: Tektronix, Inc., Beaverton, OR (US)

( * ) Notice: Subject to any disclaimer, the term of this patent is extended or adjusted under 35 U.S.C. 154(b) by 202 days.

(21) Appl. No.: 11/441,708

(22) Filed: May 26, 2006

(65) Prior Publication Data

US 2006/0282260 A1 Dec. 14, 2006

(30) Foreign Application Priority Data

May 26, 2005 (JP) ............................... 2005-154746

(51) Int. Cl.
G01R 29/26 (2006.01)
H04B 3/46 (2006.01)

(52) U.S. Cl. ...................... 324/613; 375/226

(58) Field of Classification Search ................ 324/613, 324/612, 600; 379/22.08; 714/817; 455/63.1, 455/67.13, 222, 283, 296, 310, FOR. 228; 704/226; 375/226
See application file for complete search history.

(56) References Cited

U.S. PATENT DOCUMENTS

| | | | | |
|---|---|---|---|---|
| 5,093,751 A * | 3/1992 | Yuki et al. | ................ | 360/25 |
| 5,337,014 A * | 8/1994 | Najle et al. | ................ | 324/613 |
| 5,457,585 A * | 10/1995 | Christensen | ................ | 360/75 |
| 6,424,229 B1 * | 7/2002 | Justice et al. | ................ | 331/4 |
| 6,535,560 B1 * | 3/2003 | Masenten | ................ | 375/261 |
| 6,957,019 B2 * | 10/2005 | Gupta et al. | ................ | 398/95 |
| 7,003,414 B1 * | 2/2006 | Wichelman et al. | ........... | 702/76 |
| 7,035,743 B1 * | 4/2006 | Gorin | ................ | 702/69 |
| 7,107,011 B2 * | 9/2006 | Nakazawa et al. | .......... | 455/63.1 |
| 7,123,112 B2 * | 10/2006 | Kang et al. | ............. | 331/117 FE |
| 7,164,699 B1 * | 1/2007 | Braun et al. | ............. | 372/29.022 |
| 7,245,650 B2 * | 7/2007 | Kuroyanagi et al. | ........ | 375/141 |
| 7,295,937 B2 * | 11/2007 | Dutta et al. | ................ | 702/69 |
| 7,334,253 B2 * | 2/2008 | Howard | ................ | 725/111 |
| 2002/0171457 A1 * | 11/2002 | Fujiwara | ................ | 327/113 |
| 2004/0092234 A1 * | 5/2004 | Pohjonen | ................ | 455/91 |
| 2005/0238094 A1 * | 10/2005 | Bessho et al. | ................ | 375/226 |
| 2006/0045198 A1 * | 3/2006 | Magee et al. | ................ | 375/267 |
| 2006/0222192 A1 * | 10/2006 | Matthey | ................ | 381/312 |
| 2008/0019433 A1 * | 1/2008 | Yamanouchi et al. | ....... | 375/224 |

* cited by examiner

Primary Examiner—Vincent Q Nguyen
Assistant Examiner—Hoai-An D Nguyen
(74) Attorney, Agent, or Firm—Matthew D. Rabdau; Michael A. Nelson

(57) ABSTRACT

Time variation of phase noise characteristics is displayed for measurement. A peak power of a signal under test is detected to define the frequency as a reference frequency. An offset frequency from the reference frequency is repetitively changed and each time the phase noise power is integrated for a predetermined frequency width to evaluate an integration value. The integration values are divided by the predetermined frequency width. The divided values are further divided by the peak power to evaluate noise power ratios relative to the peak power. Then, relationship between the offset frequencies, noise characteristic values and time is displayed in a graph that shows the time variation of the phase noise characteristics.

8 Claims, 3 Drawing Sheets

DISPLAY FOR MEASURING PHASE NOISE CHARACTERISTICS

BACKGROUND

Embodiments of the present invention relate to displays for noise characteristics, especially, to displays of phase noise characteristics adjacent to a desired reference frequency over time.

To evaluate characteristics of a signal generator, such as a PLL synthesizer, it is important to quantify how the output is getting to a stable state after the output frequency setting is changed. To see the transitional characteristics, lockup time, settling characteristics of frequency vs. time, settling characteristics of phase vs. time, etc. have been measured.

The signal generator should ideally provide a signal that has only a set frequency but the actual signal has noise adjacent to the desired frequency. It is referred to as phase noise. The phase noise may lead to system error on a digital communication system, such as a mobile phone system. If an output frequency is changed by frequency hopping, for example, the phase noise characteristics also show transitional change. Therefore it is also important to know how long the characteristics take to get to the stable state for evaluating the characteristics of the signal generator.

One of the conventional inventions for measuring phase noise is disclosed in U.S. Pat. No. 5,412,325 that measures power spectrum density of phase noise by three independent signal sources. However, it is not suitable for measuring transition of phase noise when a desired frequency is changed.

A spectrum analyzer is a representative apparatus for displaying and measuring frequency characteristics of a signal under test. FIG. 3 shows an example of a block diagram of a spectrum analyzer. An analog down converter 22 converts a signal under test into lower frequency signal that is converted into digital time domain data by an analog to digital converter (ADC) 24. A digital down converter converts the time domain data into a further lower frequency, which is converted into frequency domain data by an FFT (fast Fourier transform) calculation block 28. A memory 30 stores the frequency domain data and then a display 32 shows it as graphs, texts, etc. The blocks are coupled to control means that has known microprocessor, hard disk drive, keyboard, etc. (not shown). Program for control may be stored in a mass-storage unit like the hard disk drive.

A modern spectrum analyzer as shown in FIG. 3 depends largely on digital processes to produce spectrums as well as analog processes; it gets time domain data of the signal under test and converts each given number of the data into frequency domain data every predetermined period. Wherein the data unit constituting one spectrum is referred to as a frame and a frequency range derived from the one frame by FFT process is called a frequency span.

FIG. 1 is an example of a spectrum graph showing power versus frequency on a signal under test by spectrum analyzer. If the signal under test is a digital communication signal, a peak 6 may correspond to a carrier frequency and a small peak 8 do to a spurious signal. FIG. 2 is a spectrogram that shows time variation of spectrum characteristics of the signal under test by three dimensions wherein X and Y axes are frequency and time respectively and power is expressed by color variation or grayscale. In FIG. 2, the colors are replaced by monotone patterns. The spectrum waveform of FIG. 1 corresponds to a point in time, or a frame, specified by a marker 16 shown as a dotted line in FIG. 2.

Referring to FIG. 2, the spectrum waveform 12 has the highest power at the center shown as a solid line (that corresponds to the peak 6 of FIG. 1) and the power is getting weaker as it is departing from the center solid line. The waveform 12 has different frequencies on the upper and lower areas of FIG. 2 respectively because it is an example of frequency change by frequency hopping. A spotted pattern 14 shows an example of a spurious signal that corresponds to the small peak 8 shown in FIG. 1.

As for three dimensional spectrum displays, a waterfall display (not shown) is also well known as well as the spectrogram. It uses XYZ axes corresponding to frequency, time and power respectively.

Conventional phase noise characteristics have not been shown as a function of time because the measurement requires a sweep. Therefore the only way for measuring a stabilizing time of the phase noise characteristics is estimation through measurement of lockup time, settling characteristics of frequency versus time, etc.

Now the frequency hopping technology is often used for wireless communication, etc. and it is sometimes required to specify a time point on the phase noise measurement. Therefore what is desired is to express the transitional change in order to easily recognize and quantify the phase noise characteristics when the frequency setting is changed. Besides, it is further desirable to specify a time frame to measure the average, etc. of the phase noise power within the time frame.

SUMMARY

Embodiments of the present invention provide methods for displaying and measuring phase noise characteristics. A reference frequency is defined on a spectrum under test and an offset frequency from the reference frequency is repetitively changed to calculate a noise power integration value for a predetermined frequency width each time. The noise characteristics are displayed using the resultant offset frequencies and integration values. In an alternative embodiment, time variation of the noise characteristics may be displayed. In a further embodiment both, time variation of the noise characteristics and an instant in time of integration values and offset frequencies may be displayed simultaneously. To display the noise characteristics, values of the integration values divided by the predetermined frequency width may be suitable because they have the same dimension as power. Further, the reference frequency power of the spectrum under test is set to one to calculate ratios of the divided values and the ratios are displayed as the noise characteristic values to display the phase noise characteristics relative to the reference frequency power of the spectrum under test. The reference frequency may be defined by detecting a peak on the spectrum under test. The spectrum under test may be derived from a wireless communication signal and the reference frequency may correspond to a carrier frequency.

The objects, advantages and other novel features of the present invention are apparent from the following detailed description when read in conjunction with the appended claims and attached drawings.

DETAILED DESCRIPTION

Figure 3:
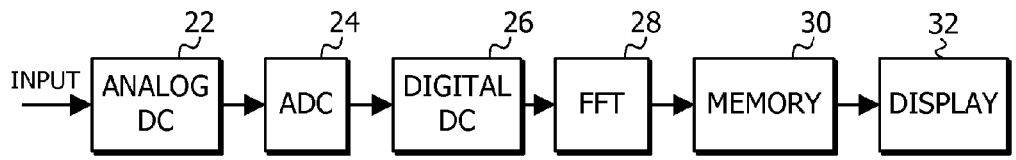
FIG. 3 is an example of a schematic block diagram of a spectrum analyzer.

Embodiments of the present invention may use the same, or similar, hardware as the conventional spectrum analyzer shown in FIG. 3 but novel software provides a display according to the present invention. The following describes an example that a signal under test is a digital wireless communication signal from which phase noise characteristics are derived. A spectrum is derived from time domain data of the signal through FFT (Fast Fourier transform) calculation as is well known and uses a number of bins N, which may also be referred to as minimum frequency units, within the frequency span to perform the calculation. The FFT calculation may be performed using the FFT calculation block 28. The spectrum of the signal under test (also referred to as the spectrum under test) has a peak at a carrier frequency of the wireless communication signal and there is phase noise adjacent to the peak.

Figure 4:
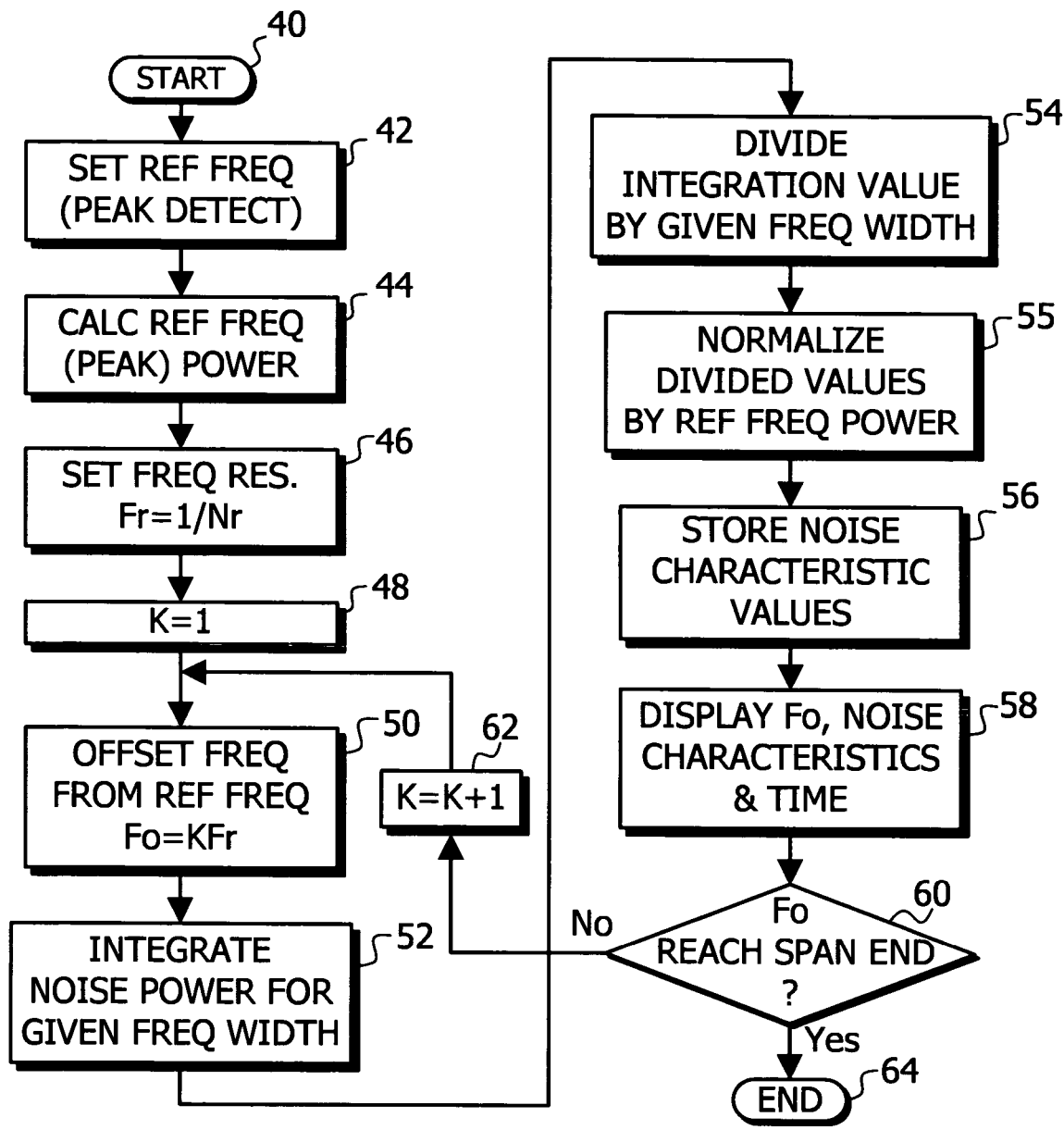
FIG. 4 is a flowchart example for processing data according to an embodiment of the present invention.

Referring to FIG. 4, a frequency fp of the spectrum under test is set as a reference frequency for measurement in a step 42. Specifically, the spectrum analyzer may detect the peak by well known peak detection to define it as the reference frequency fp. Alternatively, a user may set the reference frequency fp manually based upon a spectrum waveform on a display screen. The peak may be at a carrier frequency, for example. The peak power is measured in a step 44 to evaluate ratios of phase noise characteristics as described below.

In a step 46, a frequency resolution Fr for measuring the phase noise characteristics is set to 1/Nr wherein Nr may be a user input value from one up to the N number of the bins within the frequency span, or a default value provided by the spectrum analyzer. Set K=1 wherein K is an integer in a step 48, and an offset frequency Fo=KFr from the reference frequency fp in a step 50. The noise power is integrated for a predetermined frequency width, for example, a range from Fo−Fr/2 to Fo+Fr/2 (or the width is Fr) on the offset frequency Fo in a step 52. The integration is for averaging to reduce subtle variation of the characteristics. To align the dimension, the resultant integration value is divided by the predetermined width Fr in a step 54. The predetermined width is not limited to Fr but may be other ones, e.g., ⅔Fr and an integration range from Fo−Fr/3 to Fo+Fr/3.

Figure 6:
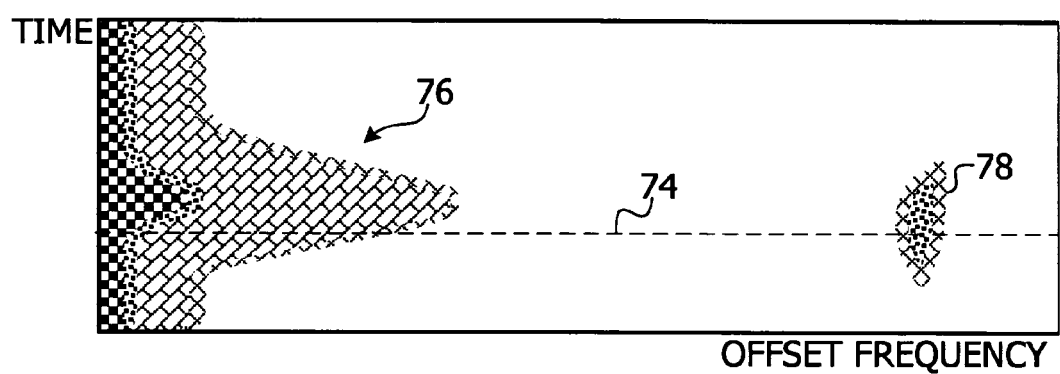
FIG. 6 is a graph showing relationship between offset frequency, noise power and time according to an embodiment of the present invention.

The divided value data is divided by the reference frequency power, or peak power to normalize it in a step 55. This process produces noise power ratio data at the respective offset frequencies as the reference frequency power is "1" so that the data is called "noise characteristic value data" below. The noise characteristic value data is stored in a memory (step 56). The data is used to display relationship between offset frequency, noise characteristic values and time as shown in FIG. 6 wherein the noise characteristic values are expressed by color variation or monochrome patterns. This process repeats until the offset frequency reaches the end of the frequency span with increasing K one by one (steps 60 and 62). In the above, the noise characteristics of the spectrum higher than the reference frequency fp are calculated but the lower side ones are also calculated similarly. If the processes for one frequency span has finished it goes to the next frame and the similar processes repeat.

Figure 1:
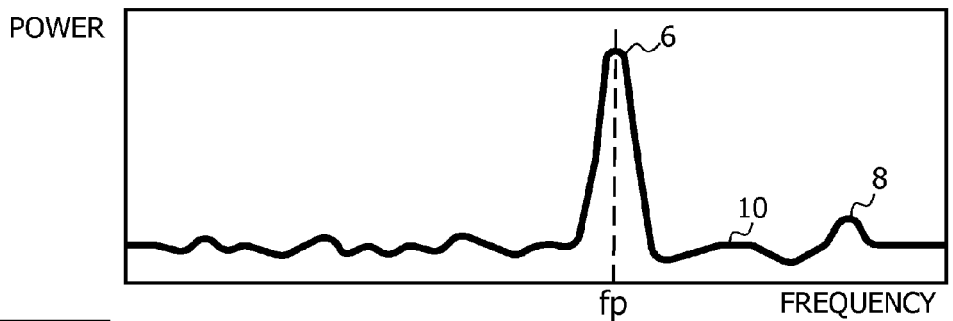
FIG. 1 is a display example of a spectrum.
Figure 2:
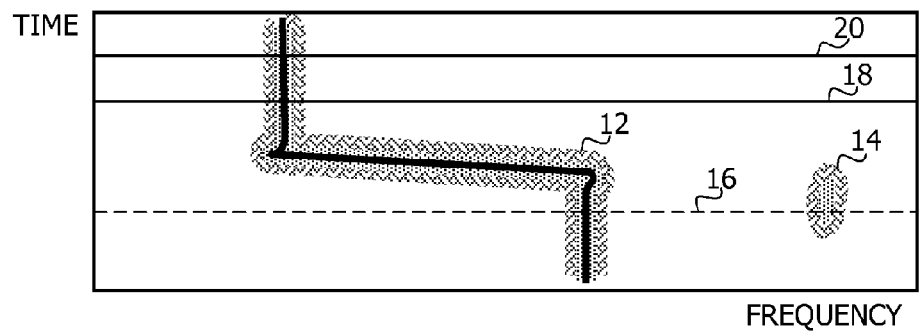
FIG. 2 is a display example of a spectrogram.
Figure 5:
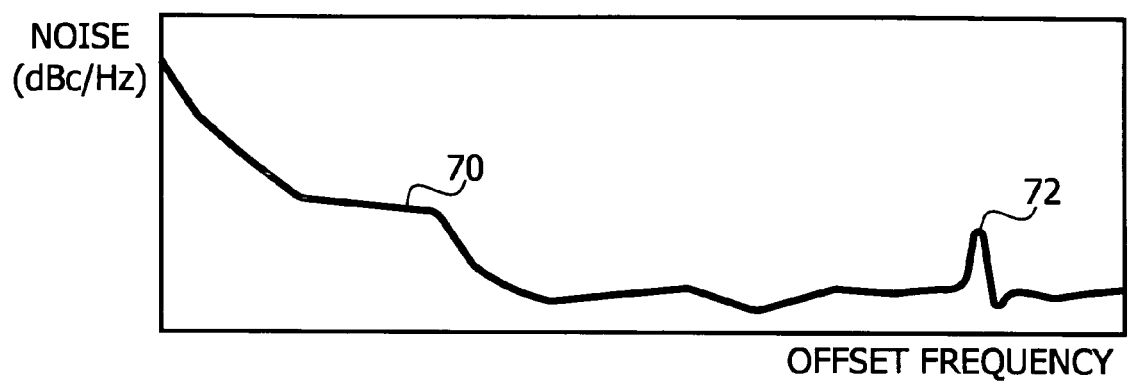
FIG. 5 is a graph showing relationship between offset frequency and noise power according to an embodiment of the present invention.

FIGS. 5 and 6 are resultant display examples of applying the processes of the present invention to the spectrum under test with the frequency hopping shown in FIGS. 1 and 2. FIG. 5 shows the phase noise characteristics for one frame. That is the phase noise characteristics on the offset frequency Fo from the reference frequency as the reference frequency power is "1". The phase noise characteristic waveform 70 has a peak 72 that corresponds to a spurious signal. Since the display in FIG. 5 is based on the reference frequency being the carrier frequency, the Y axis is termed dBc, or dB and c are short for decibel and carrier frequency respectively. In alternative embodiments, the Y axis may be simply dB, or other suitable scale. FIG. 6 is a three dimensional display of the phase noise characteristics for frames similar to a spectrogram, and shows relationship between the offset frequency Fo, noise power and time. The phase noise characteristic waveform 70 of FIG. 5 corresponds to a frame specified by a marker 74 in FIG. 6. A noise characteristic pattern 76 shows the noise characteristic variation on time. A spotted pattern 78 shows the noise characteristic variation of the spurious signal over time. The monochrome patterns shown here can be implemented using color variation, grayscale, or other suitable method.

The graph of FIG. 6 allows the user to easily realize time variation of phase noise and explicitly displays spurious occurrence as shown by the spotted pattern 78. If higher frequency resolution is required, the Nr is increased. The Nr becomes bigger by increasing FFT points to produce the spectrum.

One application of the present invention is that a time frame is defined by markers 18 and 20 shown in FIG. 2 and an averaged phase noise characteristic within the time frame is measured and displayed in a style similar to FIG. 5, but showing an average of the phase noise characteristics within a specific time. A three dimensional display with XYZ axes is also applicable as a display method.

As described, embodiments of the present invention provide display and measurement of time variation of phase noise characteristics and spurious. Therefore it is suitable for measuring various characteristics of the signal under test from a viewpoint of the characteristics of settling the phase noise.

What is claimed is:

1. A method for displaying phase noise characteristics of a spectrum under test having a plurality of frames comprising the steps of:
    defining a reference frequency for each frame of the spectrum under test;
    integrating noise power for each frame of the spectrum under test over a predetermined frequency width offset from the reference frequency to produce integration values; and
    displaying the integration values as the phase noise characteristics.

2. The method as recited in claim 1 wherein the reference frequency is defined by detecting a peak of the spectrum under test.

3. The method as recited in claim 1 wherein the reference frequency is a carrier frequency of a wireless communication signal from which the spectrum under test is derived.

4. The method as recited in claim 1 further comprising the steps of:
    dividing the integration values by the predetermined frequency width;
    calculating ratios of the divided values relative to the reference frequency power as noise characteristic values; and
    displaying the noise characteristic values as the phase noise characteristics.

5. The method as recited in claim 4 wherein time variation of the noise characteristics is displayed using the offset frequencies and the noise characteristic values.

6. The method for displaying noise characteristics as recited in claim 4 wherein the noise characteristic values are displayed by three dimensional graph having axes of offset frequency, power and time.

7. The method for displaying noise characteristics as recited in claim 5 wherein the power of the noise characteristics is expressed by colors or monochrome patterns.

8. The method for displaying noise characteristics as recited in claim 6 wherein the power of the noise characteristics is expressed by colors or monochrome patterns.

* * * * *